United States Patent
Sato et al.

(10) Patent No.: US 11,456,262 B2
(45) Date of Patent: Sep. 27, 2022

(54) INTEGRATED CIRCUIT

(71) Applicant: TEXAS INSTRUMENTS INCORPORATED, Dallas, TX (US)

(72) Inventors: Yuki Sato, Saitama (JP); Kenji Otake, Nagano (JP); Takafumi Ando, Oita (JP); Jeffrey Morroni, Parker, TX (US); Charles Allen Devries, Jr., Winfield, IL (US); Kristen Nguyen Parrish, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/138,150

(22) Filed: Dec. 30, 2020

(65) Prior Publication Data

US 2021/0343662 A1 Nov. 4, 2021

Related U.S. Application Data

(60) Provisional application No. 63/018,209, filed on Apr. 30, 2020.

(51) Int. Cl.
| | | |
|---|---|---|
| *H01L 23/64* | (2006.01) | |
| *H01L 49/02* | (2006.01) | |
| *H01L 23/31* | (2006.01) | |
| *H01L 21/78* | (2006.01) | |
| *H01L 21/48* | (2006.01) | |
| *H01L 21/56* | (2006.01) | |
| *H01L 23/495* | (2006.01) | |

(52) U.S. Cl.
CPC ........ *H01L 23/645* (2013.01); *H01L 21/4825* (2013.01); *H01L 21/565* (2013.01); *H01L 21/78* (2013.01); *H01L 23/3107* (2013.01); *H01L 23/4952* (2013.01); *H01L 28/10* (2013.01)

(58) Field of Classification Search
CPC ... H01L 23/645; H01L 23/66; H01L 21/4853; H01L 21/4832; H01L 21/4825
See application file for complete search history.

(56) References Cited

U.S. PATENT DOCUMENTS

| | | | |
|---|---|---|---|
| 5,161,098 A | 11/1992 | Balakrishnan | |
| 5,751,203 A | 5/1998 | Tsutsumi et al. | |
| 6,643,913 B2 * | 11/2003 | Uchikoba | ........... H01F 17/0013 29/609 |

(Continued)

FOREIGN PATENT DOCUMENTS

WO    2007023327 A1    3/2007

OTHER PUBLICATIONS

Search Report for PCT Application No. PCT/US2021/029049, date of mailing of international search report dated Aug. 5, 2021, 1 page.

*Primary Examiner* — Jaehwan Oh
*Assistant Examiner* — John M Parker
(74) *Attorney, Agent, or Firm* — Michael A. Davis, Jr.; Charles A. Brill; Frank D. Cimino

(57) ABSTRACT

An integrated circuit and method of making an integrated circuit is provided. The integrated circuit includes a substrate having an electronic component. A substrate-based coil is on the substrate and the substrate-based coil is electrically coupled to the electronic component. A magnetic mold compound encapsulates the substrate-based coil and the electronic component.

11 Claims, 7 Drawing Sheets

(56) References Cited

U.S. PATENT DOCUMENTS

| | | | |
|---|---|---|---|
| 6,817,085 B2 * | 11/2004 | Uchikoba | H01F 41/041 |
| | | | 29/846 |
| 7,994,888 B2 | 8/2011 | Ikriannikov | |
| 9,378,882 B2 | 6/2016 | Kummerl et al. | |
| 10,593,566 B2 | 3/2020 | Parrish et al. | |
| 2006/0096088 A1 | 5/2006 | Lotfi et al. | |
| 2010/0271161 A1 | 10/2010 | Yan et al. | |
| 2014/0203399 A1 | 7/2014 | Hofmann et al. | |
| 2015/0069572 A1 | 3/2015 | Khanolkar et al. | |

* cited by examiner

INTEGRATED CIRCUIT

RELATED APPLICATIONS

This application claims priority from U.S. Patent Application Ser. No. 63/018,209, filed 30 Apr. 2020, which is incorporated herein in its entirety.

TECHNICAL FIELD

This relates to substrate-based coils for use in low-profile integrated circuit.

BACKGROUND

An inductor or coil is a passive two-terminal device that stores energy in a magnetic field in response to current passing through the inductor. DC-DC converters are electronic devices that use coils to convert an input direct current (DC) voltage into one or more DC output voltages. The DC output voltage(s) may be higher (boost or step-up converter) or lower (buck or step-down converter) than the DC input voltage.

Some DC-DC converters may include a switch for alternately opening and closing a current path through an inductor in response to a switching signal. In operation, a DC voltage is applied across the inductor. Electrical energy is transferred to a load connected to the inductor by alternately opening and closing the switch as a function of the switching signal. The amount of electrical energy transferred to the load is a function of the duty cycle of the switch and the frequency of the switching signal. DC-DC converters are used in electronic portable devices, particularly battery-powered devices, such as portable cellular phones, laptop computers, and other electronic systems in which efficient use of power is desirable.

SUMMARY

In described examples, a method of fabricating integrated circuits includes providing a substrate having an array of electronic components and attaching a sheet array of substrate-based coils to the substrate where respective substrate-based coils are aligned with respective electronic components. The substrate having the array of electronic components and the sheet of substrate-based coils are encapsulated with a magnetic mold compound. The array of electronic components and respective substrate-based coils are singulated to form the integrated circuits.

In another described example, an integrated circuit includes a substrate having an electronic component. A substrate-based coil is on the substrate and the electronic component and is electrically coupled to the electronic component. A magnetic mold compound encapsulates the substrate-based coil and the electronic component.

DETAILED DESCRIPTION

To fabricate smaller integrated circuit die, reducing the profile of integrated circuits (IC) that use coils (inductors), such as DC-DC converter modules, and integrating the coils into a package with the die is important to creating a low-profile power modules. Described herein are substrate-based coils and a method to make thereof for use in an IC, such as in DC-DC converter modules, transformers, etc. The substrate-based coils and the die are integrated into the same package and molded with a magnetic mold compound (MMC) to achieve the low-profile IC. The substrate-based coils are copper (Cu)-plated coils that are applied to a dielectric by methods, such as printing, etching and depositing, plating, etc. to create a sheet of coils. The process of fabricating the coils creates a very narrow gap between the coils, which leads to a higher inductance.

In the fabrication method described herein for the example IC, the IC is fabricated in an array that includes a number of ICs. Each IC of the array includes a substrate (leadframe) on which electronic components are mounted or embedded. A die comprising semiconductors and passive components (other than magnetics) is affixed to or embedded in the substrate. Thereafter the sheet of coils is disposed atop the die and affixed to the substrate. The entire array of electronic components, including the coils and the die, is encapsulated in the MMC after attachment of the sheets of coils to the substrate. After encapsulation, the ICs are singulated. Implementations of this description allow for a low-profile IC due to the fabrication of the substrate-based coils and by encapsulating the entire IC in the MMC.

Figure 1:
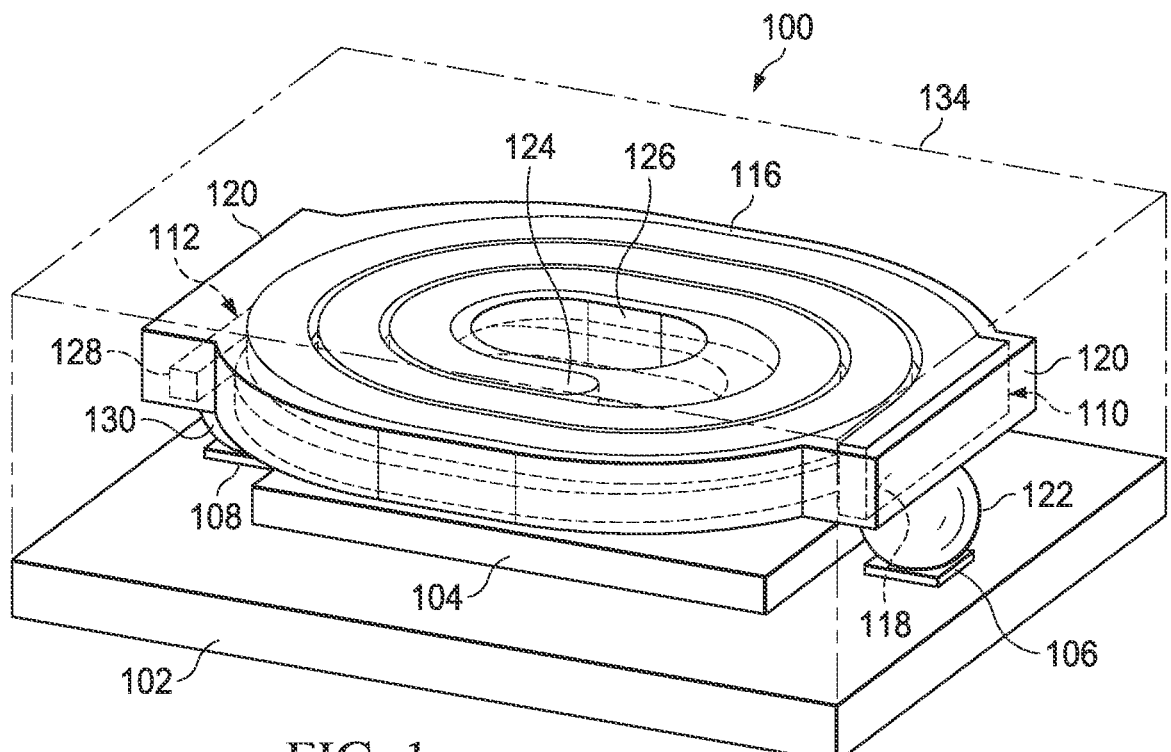
FIG. 1 is a perspective view of an example low-profile switching integrated circuit that includes substrate-based coils in accordance with various examples.
Figure 2:
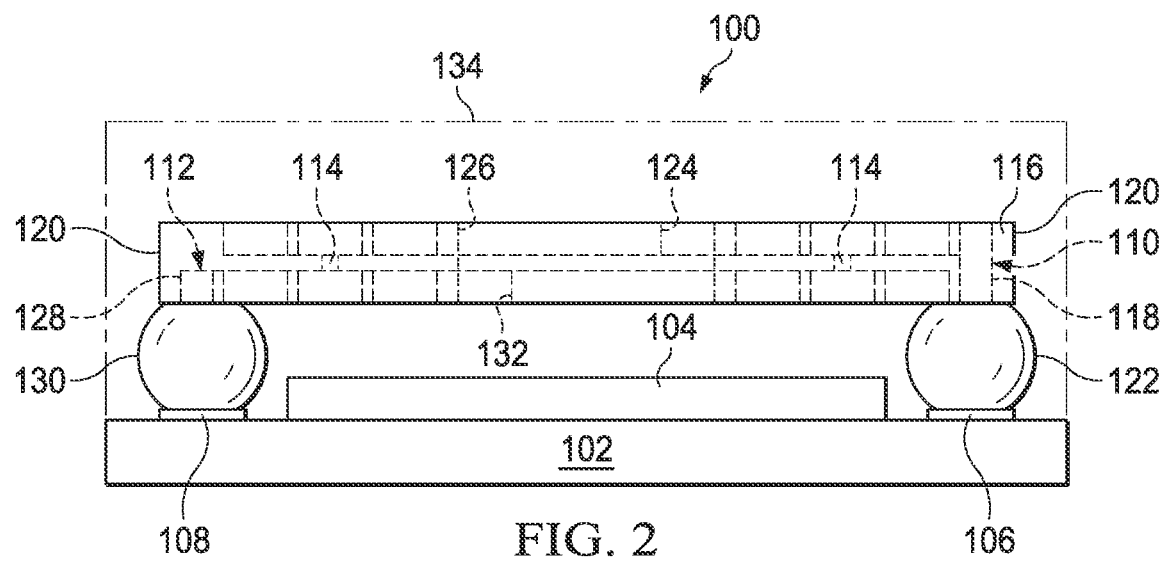
FIG. 2 is a front view of the low-profile integrated circuit of FIG. 1.

FIGS. 1 and 2 are perspective and front views of a low-profile IC (e.g., DC-DC converter module) 100 that includes substrate-based coils (inductors) in accordance with various examples. The IC 100 includes a substrate (leadframe) 102 and electronic components 104 attached to a surface of the substrate 102. The substrate 102 is an interconnect board interconnected to the electronic components 104 and includes first and second substrate contacts 106, 108 disposed on the surface of the substrate 102. The electronic components 104 may include one or more power supply switching components (e.g., a power supply controller and/or discrete transistors) or various other electronic components (e.g., resistors, capacitors, etc.).

The IC 100 further includes a substrate-based coil comprising a first coil portion 110, a second coil portion 112, and coil interconnects 114, via copper (Cu) plating, (see FIG. 2) disposed in adjoining dielectric layers (e.g., FR4, Teflon, etc.) 116. A first end 118 of the first coil portion 110 terminates proximate an outer periphery 120 of the dielectric layer 116 and is connected to the first substrate contact 106 via a first substrate interconnect (e.g., solder ball) 122. A second end 124 of the first coil portion 110 terminates proximate a center 126 of the dielectric layer 116. A first end 128 of the second coil portion 112 terminates proximate the outer periphery 120 of the dielectric layer 116 at an opposite side than that of the termination of the first end 118 of the first coil portion 110. The first end 128 of the second coil portion 112 is connected to the second substrate contact 108 via a second substrate interconnect 130. A second end 132 of the second coil portion 112 terminates proximate the center 126 of the dielectric layer 118.

A magnetic mold compound (MMC) 134 encapsulates the electronic components 104, the first and second coil portions 110, 112, and the dielectric layer 118 to form the IC 100. The MMC 134 applied to encapsulate the IC 100 may include ferromagnetic material, such as ferrite that enhances the operation of (e.g., increases the inductance of) the first and second coil portions 110, 112. The MMC 134 also provides shielding from electromagnetic interference, and protects the electronic components of the IC 100 from the environment.

Figure 3:
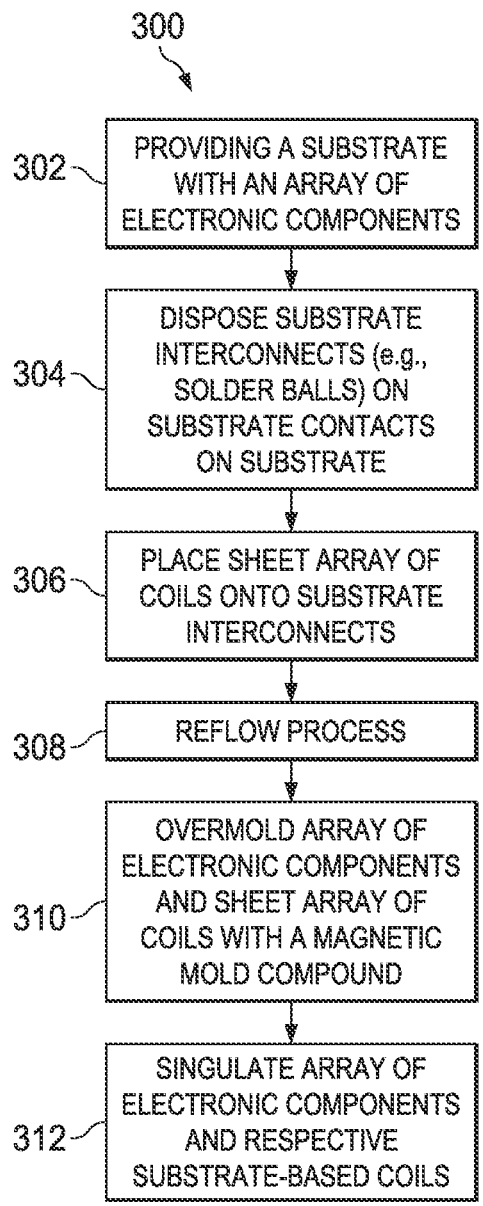
FIG. 3 is a flow diagram for a method of fabricating the low-profile integrated circuit of FIG. 1.
Figure 4:
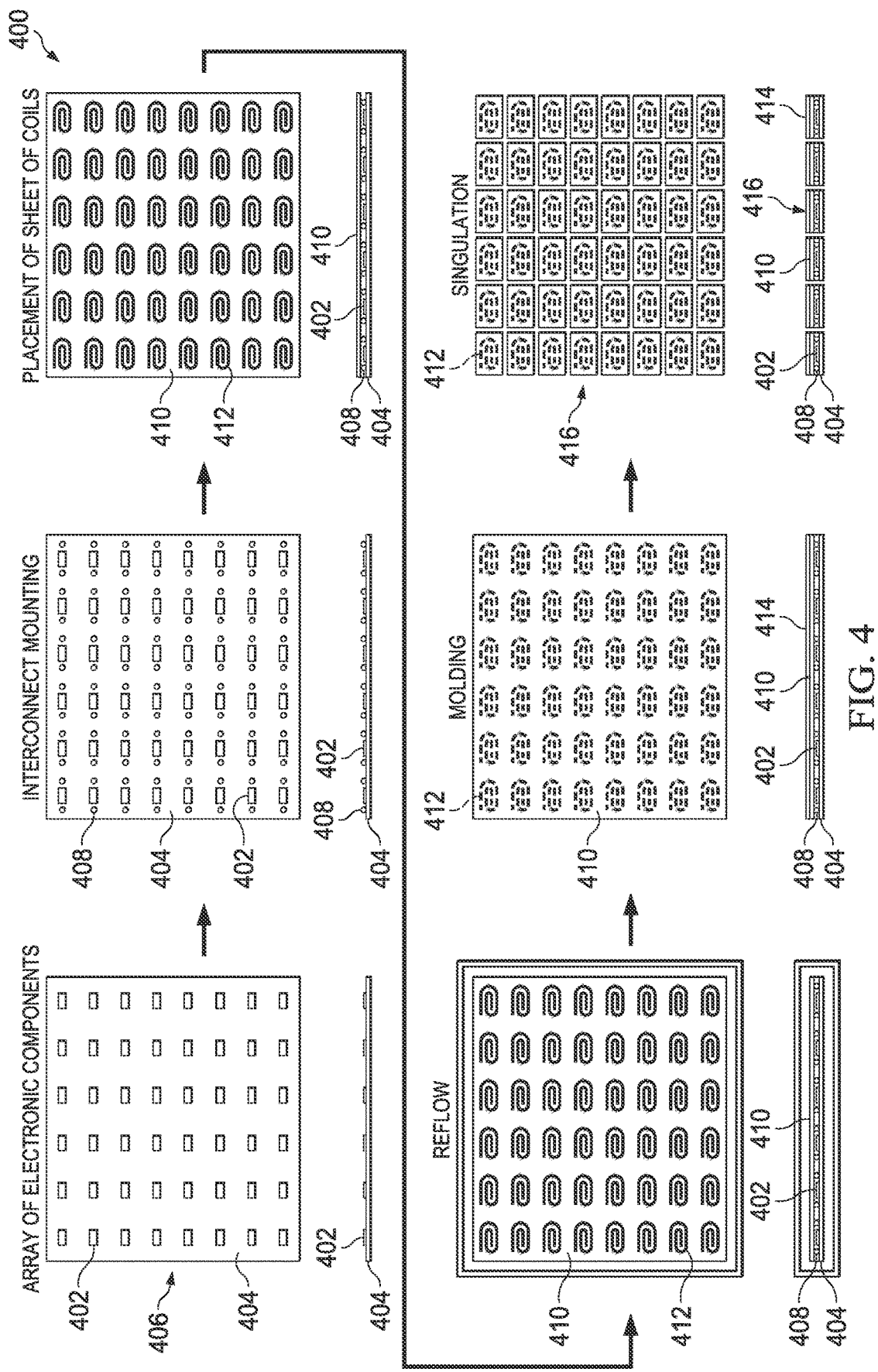
FIG. 4 shows top and front views of a process diagram illustrating the method of fabricating the low-profile integrated circuit of FIG. 1.

FIGS. 3 and 4 illustrate a flow diagram 300 and a flow process 400 respectively for fabricating low-profile ICs in accordance with various examples. Though depicted sequentially as a matter of convenience, at least some of the actions shown can be performed in a different order and/or performed in parallel. Alternatively, some implementations may perform only some of the actions shown.

In block 302, an array of electronic components 402 are attached to a substrate 404 to form an array of electronic component modules 406. The substrate 404 may be one-dimensional or two-dimensional. For example, module substrates may be formed on a sheet of substrate material, such as printed circuit board material. In some implementations, a module substrate may include a lead frame, have laminate material, have ceramic material, or other metal/dielectric arrangement that provides conductive connections for electronic components of the switch-mode converter and terminals for connection of the switch-mode converter module to an external device or circuit.

Electronic components, such as a die, semiconductors, resistors, and/or capacitors are attached to the substrate of each IC being fabricated. For example, if an 8×8 array of ICs is being fabricated, then one or more dies (e.g., power supply controller integrated circuits, or switching transistors) and associated resistors, capacitors, etc. may be attached to each of the 64 module substrates of the 8×8 array. The components may be affixed to the substrate by solder paste, conductive adhesive, or other adhesive substance suitable for attaching electronic components to a substrate. Alternatively, the electronic components can be embedded in the substrate.

In block 304, substrate interconnects (e.g., solder balls, bump bonds, etc.) 408 are disposed on substrate contacts that are disposed on a surface of the substrate. The substrate interconnects 408 may be disposed by methods, such as evaporated solder bumping, electroplated solder bumping, printed solder bump formation, or solder ball bumping.

In block 306, a sheet array 410 of coils 412 is placed on the substrate interconnects 408. The sheet array 410 of coils 412 are aligned on the substrate 404 such that respective substrate-based coils 412 are aligned with respective electronic components 402 from the array of electronic components 402. The sheet array 410 of coils 412 are substrate-based coils that may be fabricated by methods, such as printing, etching and depositing, plating, etc.

Figure 5:
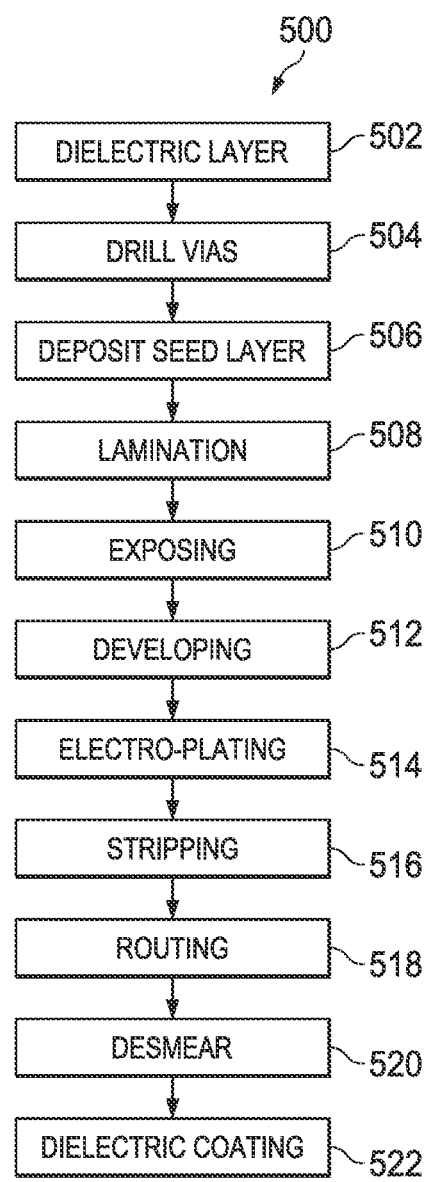
FIG. 5 is a flow diagram illustrating an example method of processing the substrate-based coils of FIG. 1.
Figure 6:
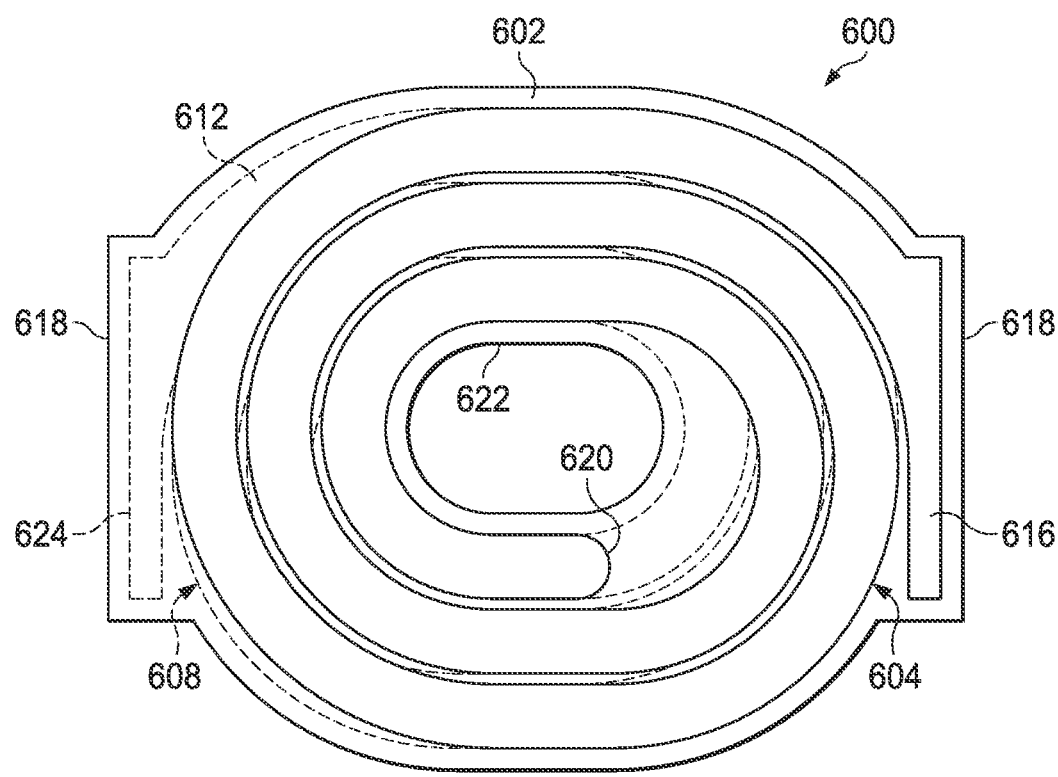
FIGS. 6 and 7 are top and front views of the substrate-based coils in accordance with various examples.
Figure 7:
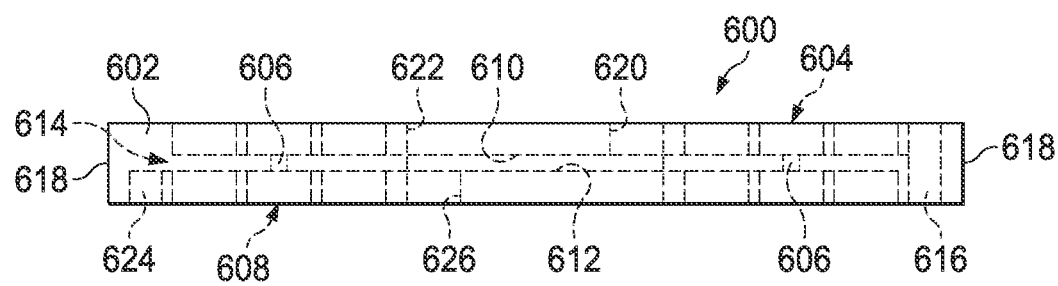

For example, FIG. 5 is a flow diagram 500 of one example process to fabricate the sheet of substrate-based coils 600 in a dielectric layer 602 illustrated in FIGS. 6 and 7. The process begins in block 502 with a first dielectric layer (e.g., FR4, Teflon, etc.). In block 504, vias are laser drilled into a first dielectric layer. In block 506, a seed layer of an electrically conductive material (e.g., copper) is deposited on the first dielectric layer. In block 508, the first dielectric layer is laminated with a thin layer of photoresist. In block 510, the coil pattern is digitally formed onto the first dielectric layer by a laser (e.g., laser direct imaging). In block 512, a developer is applied to the first dielectric layer to remove the photoresist layer in places that are not protected by a mask. In block 514, the electrically conductive material is deposited on the surface of the dielectric layer in the coil pattern formed by the laser. In block 516, the remaining photoresist layer is stripped away via a chemical process. In block 518, wire traces are routed on the dielectric layer to make electrical connections to external components. In block 520, a desmear process is performed to remove any resin from the vias. In block 522, a dielectric coating is applied to the dielectric layer. The process forms a first coil portion 604 in a first dielectric layer.

The process is repeated in a similar fashion to create coil interconnects 606, via CU-plating, in a second dielectric layer that overlays the first dielectric layer. Finally, the process is repeated to form a second coil portion 608 in a third dielectric layer that overlays the second dielectric layer. The formation of the first, second, and third dielectric layers form the dielectric layer 602 illustrated in FIGS. 6 and 7.

The first and second coil portions 604, 608 are stacked adjacent to one another (see FIG. 7) such that a surface 610 of the first coil portion 604 faces a surface 612 of the second coil portion 608. The first and second coil portions 604, 608 are separated by a narrow gap 614. The narrow gap 614 between the first and second coil portions 604, 608 creates a low-profile IC having a higher inductance. A first end 616 of the first coil portion 604 terminates proximate an outer periphery 618 of the dielectric layer 602 and is connected a respective substrate interconnect. A second end 620 of the first coil portion 604 terminates proximate a center 622 of the dielectric layer 602. Similarly, a first end 624 of the second coil portion 608 terminates proximate the outer periphery 618 of the dielectric layer 602 at an opposite side than that of the termination of the first end 616 of the first coil 604. The first end 624 of the second coil portion 608 is connected a respective substrate interconnect. A second end 626 of the second coil portion 608 terminates proximate the center 622 of the dielectric layer 602.

Referring back to FIGS. 3 and 4, in block 308, the array of electronic components 402 and the sheet array 410 of coils 412 are bonded to the substrate 404. More specifically, a reflow process is performed to apply solder and heat to the substrate interconnects to mechanically and electrically attach the array of electronic components 402 and the sheet array 410 of coils 412 to the substrate 404. The heat may be supplied by a heat source, such as a reflow oven or an infrared lamp.

In block 310, the array of electronic components 402 and the sheet array 410 of coils 412 are overmolded with the MMC 414. The MMC 414 applied to encapsulate the array of electronic components 402 and the sheet array 410 of coils 412 may include ferromagnetic material, such as ferrite that enhances the operation of (e.g., increases the inductance of) the coils 412. The MMC 414 also provides shielding from electromagnetic interference, and protects the electronic components of the IC 416 from the environment.

In block 312, the array of electronic components 402 and respective substrate-based coils are singulated to form the IC 416. The singulation may include dicing, sawing, cutting with a laser, etc. the molded array along row and column boundaries that separate the individual ICs. For example, the singulation may include cutting through the MMC 414 and the substrate 404 to separate one IC 416 from another.

Figure 8:
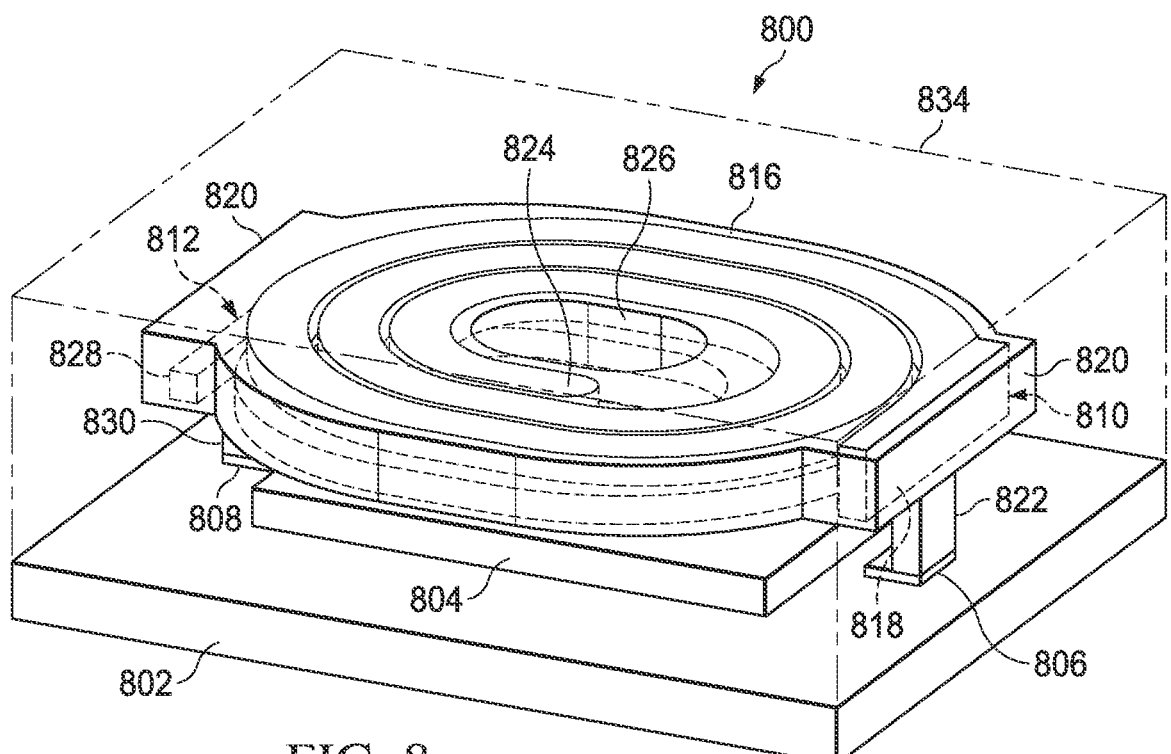
FIG. 8 is a perspective view of another example of a low-profile integrated circuit that includes substrate-based coils in accordance with various examples.
Figure 9:
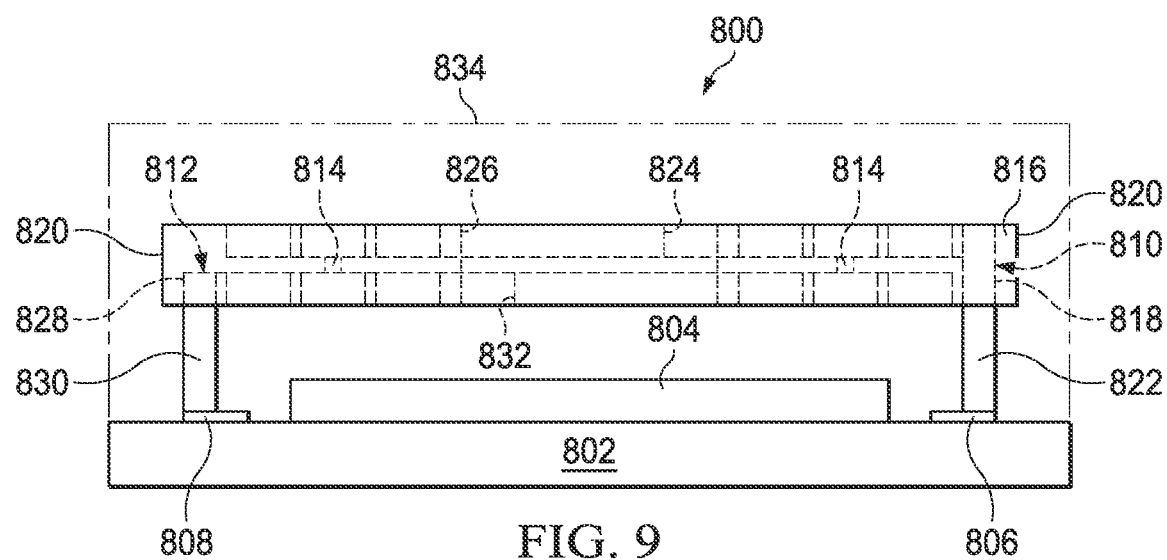
FIG. 9 is a front view of the low-profile integrated circuit of FIG. 7.

FIGS. 8 and 9 are perspective and front views of another example of a low-profile IC (e.g., DC-DC converter module) 800 that includes substrate-based coils in accordance with various examples. The IC 800 is similar to the IC 800 described above, except with different type of substrate interconnects that connect the coils to the substrate.

The IC 800 includes a substrate (leadframe) 802 and electronic components 804 attached to a surface of the substrate 802. The substrate 802 functions as an interconnect board interconnected to the electronic components 804 and includes first and second substrate contacts 806, 808 disposed on the surface of the substrate 802. The electronic components 804 may include one or more power supply switching components (e.g., a power supply controller and/or discrete transistors) or various other components (e.g., resistors, capacitors, etc.).

The IC 800 further includes a first coil portion 810, a second coil portion 812, and coil interconnects 814, via Cu-plating, disposed in adjoining dielectric layers (e.g., FR4, Teflon, etc.) 816. A first end 818 of the first coil portion 810 terminates proximate an outer periphery 820 of the dielectric layer 816 and is connected to the first substrate contact 806 via a first pillar interconnect 822. A second end 824 of the first coil portion 810 terminates proximate a center 826 of the dielectric layer 816. A first end 828 of the second coil portion 812 terminates proximate the outer periphery 820 of the dielectric layer 816 at an opposite side than that of the termination of the first end 818 of the first coil portion 810. The first end 828 of the second coil portion 812 is connected to the second substrate contact 808 via a second pillar interconnect 830. A second end 832 of the second coil portion 812 terminates proximate the center 826 of the dielectric layer 816.

A magnetic mold compound (MMC) 834 encapsulates the electronic components 804, the first and second coil portions 810, 812, and dielectric layer 816 to form the IC 800. The MMC 834 applied to encapsulate the IC 800 may include ferromagnetic material, such as ferrite that enhances the operation of (e.g., increases the inductance of) the first and second coil portions 810, 812. The MMC 834 also provides shielding from electromagnetic interference, and protects the electronic components of the IC 800 from the environment.

Figure 10:
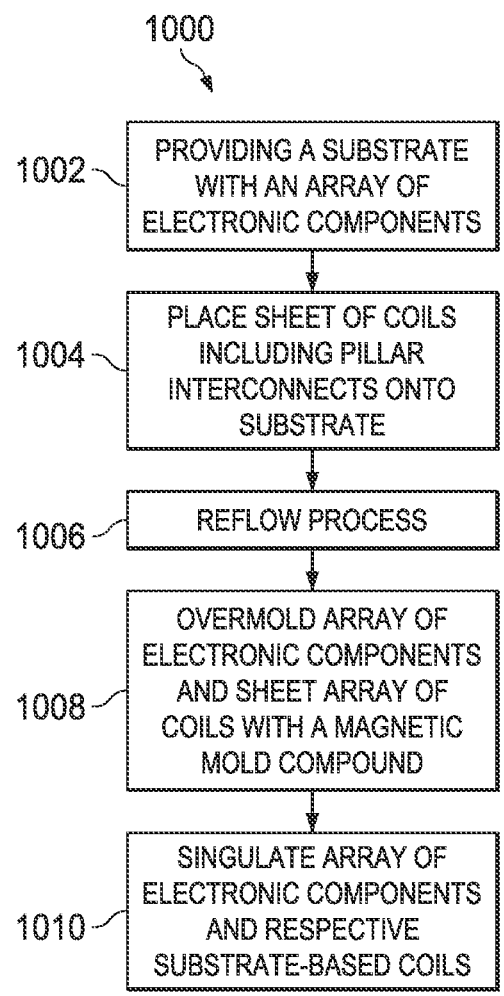
FIG. 10 is a flow diagram for a method of fabricating the low-profile integrated circuit of FIG. 7.
Figure 11:
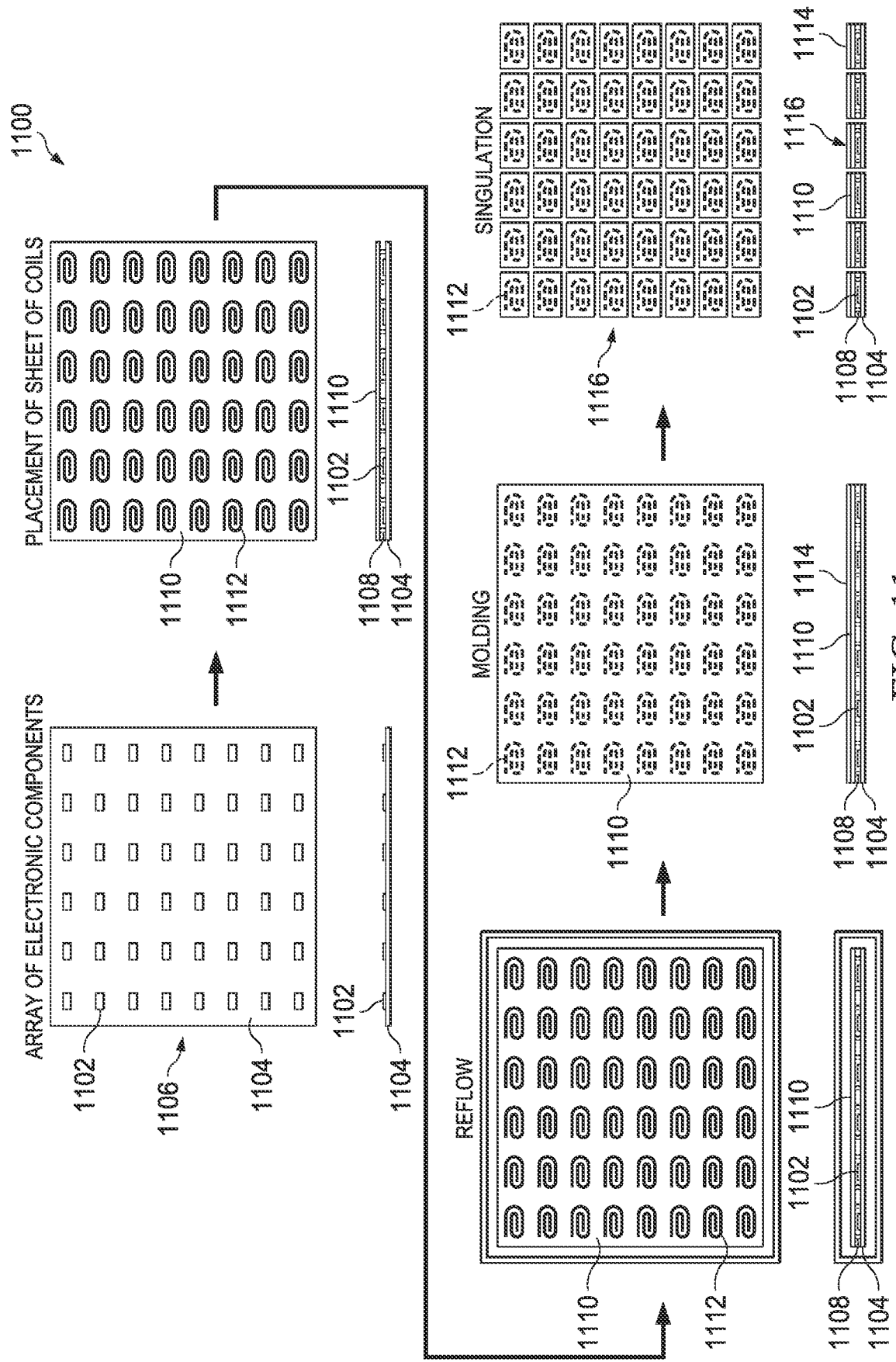
FIG. 11 shows top and front views of a process diagram illustrating the method of fabricating the low-profile integrated circuit of FIG. 7.

FIGS. 10 and 11 illustrate a flow diagram 1000 and a flow process 1100 respectively for fabricating ICs in accordance with various examples. Though depicted sequentially as a matter of convenience, at least some of the actions shown can be performed in a different order and/or performed in parallel. Alternatively, some implementations may perform only some of the actions shown.

In block 1002, an array of electronic components 1102 are attached to a substrate 1104 to form an array of electronic component modules 1106. The substrate 1104 may be one-dimensional or two-dimensional. For example, module substrates may be formed on a sheet of substrate material, such as printed circuit board material. In some implementations, a module substrate may include a lead frame, laminate material, ceramic material, or other metal/dielectric arrangement that provides conductive connections for electronic components of the switch-mode converter and terminals for connection of the switch-mode converter module to an external device or circuit.

A die, semiconductors, resistors, and/or capacitors of the DC-DC converter module are attached to the substrate of each switch-mode converter module being fabricated. For example, if an 8×8 array of DC-DC converter modules is being fabricated, then one or more dies (e.g., power supply controller integrated circuits, or switching transistors) and associated resistors, capacitors, etc. may be attached to each of the 64 module substrates of the 8×8 array. The components may be affixed to the substrate by solder paste, conductive adhesive, or other adhesive substance suitable for attaching electronic components to a substrate.

In block 1004, a sheet array 1110 of coils 1112, which includes pillar interconnects 1108, is placed on the substrate 1104. The sheet array 1110 of coils 1112 are aligned on the substrate 1104 such that respective substrate-based coils 1112 are aligned with respective electronic components 1102 from the array of electronic components 1102. The sheet array 1110 of coils 1112 are substrate-based coils that may be fabricated by methods, such as printing, etching, and depositing, plating, etc., as described above and as illustrated in the flow diagram 500 of FIG. 5. In this example however, the pillar interconnects 1108 are pillars made from the same conductive material (e.g., copper) as the coils 1112. The pillar interconnects 1108 are made by filling vias in an adjoining (fourth) dielectric layer. The adjoining dielectric layer is then removed via etching, thereby leaving only the pillar interconnects 1108, which are connected to respective substrate-based coils 1112. After the sheet array 1110 of coils 1112 is placed on the substrate 1104, the pillar interconnects 1108 attach to substrate contacts on the substrate 1104. As a result, the process of depositing the substrate interconnects (e.g., solder balls) on the substrate illustrated in FIG. 4 can be omitted.

In block 1006, the array of electronic components 1102 and the sheet array 1110 of coils 1112 are bonded to the substrate 1104. More specifically, a reflow process is performed to apply solder and heat to the pillar interconnects 1108 to mechanically and electrically attach the array of electronic components 1102 and the sheet array 1110 of coils 1112 to the substrate 1104 via the substrate contacts. The heat may be supplied by a heat source, such as a reflow oven or an infrared lamp.

In block 1008, the array of electronic components 1102 and the sheet array 1110 of coils 1112 are overmolded with the MMC 1114. The MMC 1114 applied to encapsulate the array of electronic components 1102 and the sheet array 1110 of coils 1112 may include ferromagnetic material, such as ferrite that enhances the operation of (e.g., increases the inductance of) the coils 1112. The MMC 1114 also provides shielding from electromagnetic interference, and protects the electronic components of the IC from the environment.

In block 1010, the array of electronic components 1102 and respective substrate-based coils 1112 are singulated to form the ICs 1116. The singulation may include dicing, sawing, cutting with a laser, etc. the molded array along row and column boundaries that separate the individual ICs 1116. For example, the singulation may include cutting through the MMC 1114 and the substrate 1104 to separate one IC 1116 from another.

Modifications are possible in the described embodiments, and other embodiments are possible, within the scope of the claims.

What is claimed is:

1. A method of fabricating integrated circuits, the method comprising:
    providing a substrate having an array of electronic components;
    attaching a sheet array of substrate-based coils to the substrate where respective substrate-based coils are aligned with respective electronic components;
    encapsulating the substrate having the array of electronic components and the sheet of substrate-based coils with a magnetic mold compound; and
    singulating the array of electronic components and respective substrate-based coils to form the integrated circuits.

2. The method of claim 1, wherein attaching a sheet array of substrate-based coils to the substrate where respective substrate-based coils are aligned with respective electronic components comprises:
    disposing substrate interconnects on substrate contacts, disposed on the substrate, of respective electronic components;
    placing the sheet array of substrate-based coils on the substrate interconnects with respective coil ends of respective coils coupled to respective substrate contacts; and
    bonding the sheet array of substrate-based coils to the substrate.

3. The method of claim 2, wherein the substrate interconnects are bump bonds, and the bonding the sheet array of substrate-based coils to the substrate comprises performing a reflow process to apply solder and heat to the bump bonds and the substrate contacts to mechanically and electrically bond the sheet array of substrate-based coils to the substrate.

4. The method of claim 1, wherein attaching a sheet array of substrate-based coils to the substrate where respective substrate-based coils are aligned with respective electronic components comprises:
    providing the sheet array of substrate-based coils with respective pillar interconnects extending from the substrate-based coils;
    placing the sheet array of substrate-based coils on the substrate where the pillar interconnects align with respective substrate contacts, of respective electronic components, disposed on the substrate; and
    bonding the sheet array of substrate-based coils to the substrate.

5. The method of claim 4, wherein the bonding the sheet array of substrate-based coils to the substrate comprises performing a reflow process to apply solder and heat to the pillar interconnects and the substrate contacts to mechanically and electrically bond the sheet array of substrate-based coils to the substrate.

6. The method of claim 1, further comprising forming the sheet array of substrate-based coils, wherein the forming comprises:
    forming first coil portions in a first dielectric layer;
    forming coil interconnects in second dielectric layer over the first dielectric layer; and
    forming second coil portions in a third dielectric layer over the second dielectric layer, where a respective coil interconnect connects a first coil portion and a second coil portion for each of the first coil portions and the second coil portions to form the sheet array of substrate-based coils.

7. The method of claim 6, further comprising forming pillar interconnects in a fourth dielectric layer over the third dielectric layer, including: a first pillar interconnect extending from an end of one of the first coil portions; and a second pillar interconnect extending from an end of one of the second coil portions.

8. The method of claim 7, wherein the first coil portions, the coil interconnects, the second coil portions, and the pillar interconnects are formed by one of printing, etching and depositing, or plating.

9. The method of claim 6, wherein the first coil portions have respective first ends terminating at a periphery of the first dielectric layer, the second coil portions have respective first ends terminating at a periphery of the third dielectric layer at an opposite side than the respective first ends of the first coil portions, the respective first ends of the first coil portions connect to the substrate via a first substrate interconnect, and the respective first ends of the second coil portions connect to the substrate via a second substrate interconnect.

10. The method of claim 9, wherein the first coil portions have respective second ends terminating proximate a center of the first dielectric layer, and the second coil portions have respective second ends terminating proximate a center of the third dielectric layer.

11. The method of claim 6, wherein forming the first coil portions in the first dielectric layer and forming the second coil portions in the third dielectric layer forms a gap between the first coil portions and the second coil portions creating a high inductance.

* * * * *